United States Patent [19]

Hayashi

[11] Patent Number: 5,472,822
[45] Date of Patent: Dec. 5, 1995

[54] MESOLONIC COMPOUNDS IN THE PREPARATION OF LITHOGRAPHIC PRINTING PLATE BY DIFFUSION TRANSFER

[75] Inventor: Katsumi Hayashi, Kanagawa, Japan

[73] Assignee: Fuji Photo Film Co., Ltd., Kanagawa, Japan

[21] Appl. No.: 955,069

[22] Filed: Oct. 1, 1992

[30] Foreign Application Priority Data

Oct. 2, 1991 [JP] Japan .................. 3-282251

[51] Int. Cl.$^6$ .................. G03C 8/06; G03C 5/38; G03F 7/07
[52] U.S. Cl. .................. 430/204; 430/251; 430/455; 430/456; 430/459
[58] Field of Search .................. 430/204, 251, 430/233, 455, 456, 459

[56] References Cited

U.S. PATENT DOCUMENTS

| | | | |
|---|---|---|---|
| 4,003,910 | 1/1977 | Bartels-Keith et al. | 430/251 |
| 4,047,955 | 9/1977 | Greenwald | 430/251 |
| 4,297,430 | 10/1981 | Kanada et al. | 430/251 |
| 4,378,424 | 3/1983 | Altland et al. | 430/455 |
| 5,037,726 | 8/1991 | Kojima et al. | 430/598 |
| 5,200,294 | 4/1993 | Dekeyzer et al. | 430/204 |

FOREIGN PATENT DOCUMENTS

| | | |
|---|---|---|
| 0431568 | 6/1991 | European Pat. Off. . |
| 0533182 | 3/1993 | European Pat. Off. . |
| 3500499 | 7/1985 | Germany . |

*Primary Examiner*—Richard L. Schilling
*Attorney, Agent, or Firm*—Sughrue, Mion, Zinn, Macpeak & Seas

[57] ABSTRACT

A lithographic printing plate is prepared from a silver halide photosensitive material in accordance with a silver complex diffusion transfer process. The photosensitive material is exposed and developed with a diffusion transfer processing solution containing a mesoionic compound as a silver halide complexing agent. The printing plate has good ink receptivity and minimized plate wear. The processing solution is free from the problems of corrosion and waste solution disposal.

14 Claims, No Drawings

MESOLONIC COMPOUNDS IN THE PREPARATION OF LITHOGRAPHIC PRINTING PLATE BY DIFFUSION TRANSFER

FIELD OF THE INVENTION

This invention relates to a method for preparing a lithographic printing plate in accordance with a silver complex diffusion transfer process, and a processing solution used therefor.

BACKGROUND OF THE INVENTION

Printing plates designed such that a silver image obtained by a silver complex diffusion transfer process which is one of photographic reproduction processes is used as an offset printing master are known in the art as disclosed in Japanese Patent Publication (JP-B) Nos. 43132/1971 and 30562/1973. Further, positive type printing masters are disclosed in Japanese Patent Application Kokai (JP-A) No. 55402/1974 and negative ones disclosed in JP-A 106902/1977 and 112402/1977.

Typically the silver complex diffusion transfer process adapted for the preparation of lithographic printing plates is carried out by imagewise exposing a photosensitive material comprising an undercoat layer also serving for anti-halation purpose, a silver halide emulsion layer, and a physical development nucleus layer on a support, and developing the material whereupon the silver halide having a latent image formed therein is converted into black silver in the emulsion layer. At the same time, the silver halide having no latent image formed is dissolved by the action of a silver halide complexing agent in the developer and diffused to the surface of the photosensitive material. The thus dissolved and diffused silver complex salt precipitates on physical development nuclei of the surface layer due to the reducing action of the developing agent, forming a silver image. To enhance the ink receptivity of the silver image, the development step is optionally followed by sensitization. Then the plate is set in an offset press for receiving ink and transmitting an ink image to an ink-receptive sheet.

These printing plates should meet a set of properties which depend not only on a particular type of ink-receptive sheet, but also largely on their preparation process, especially a development step. That is, one of key factors dictating printing characteristics is the state of a transfer-developed silver image, which is, in turn, dictated by conditions of forming transfer silver grains, for example, the diffusion rate, stability and reduction rate of the silver complex salt.

A number of silver halide complexing agents are known for use in the development step of diffusion transfer process. Examples include (1) thiosulfate salts, (2) thiocyanate salts, (3) aminothiosulfates as disclosed in U.S. Pat. No. 3,169,992, (4) cyclic imide compounds as disclosed in U.S. Pat. No. 2,857,276, (5) 2-mercaptobenzoic acids as disclosed in JP-B 4099/1986, and (6) thiosalicylic acids and cyclic imide compounds having a five or six-membered ring as disclosed in JP-B 4100/1986. Printing plates which are prepared through development with such silver halide complexing agents have the advantages of high sensitivity, high resolution, and high image reproducibility, but are prone to plate wear as compared with other practical printing plates such as presensitized plates. It is thus desired to improve the plate wear of such plating plates.

Among the above-mentioned silver halide complexing agents, thiocyanates can be used to form a well ink-receptive silver image with the concomitant benefit of a reduced cost. This procedure, however, has several problems including (1) corrosion in that thiocyanates are metal corrosive and thus tend to attack parts of the processing equipment, (2) restricted solution disposal in that thiocyanate solution is classified as cyan-containing solution according to the waste water regulation and must be deliberately treated before discarding to the environment, (3) cumbersomeness in that thiocyanates are deliquescent so that their handling is difficult and their processing solution requires care during preparation, (4) careful management of processing solution in that ink-receptivity largely depends on the amount of thiocyanate added.

SUMMARY OF THE INVENTION

A primary object of the present invention is to provide an improved method for preparing a lithographic printing plate featuring high ink-receptivity, little or no scumming, and outstandingly reduced plate wear.

Another object of the present invention is to provide an improved diffusion transfer processing solution which has eliminated the corrosion and solution disposal problems and is easy to handle and manage.

In a first form, the present invention is directed to a method for preparing a lithographic printing plate from a photosensitive material comprising at least a silver halide emulsion layer and a physical development nucleus layer on a support in accordance with a silver complex diffusion transfer process. The photosensitive material is developed with a diffusion transfer processing solution which contains a mesoionic compound.

A diffusion transfer processing solution containing a mesoionic compound for use in the preparation of a planographic printing plate is also contemplated.

DETAILED DESCRIPTION OF THE INVENTION

According to the present invention, a lithographic or planographic printing plate is prepared by processing a photosensitive material with a processing solution in accordance with a silver complex diffusion transfer process for forming a silver image. The photosensitive material includes at least a silver halide emulsion layer and a physical development nucleus layer on a support. The diffusion transfer processing solution contains a silver halide complexing agent in the form of a mesoionic compound. A developing agent may be contained in either the processing solution or the photosensitive material.

The mesoionic compound is contained in the processing solution as a silver halide complexing agent and is effective in dissolving the silver halide in the emulsion layer where no latent image has been formed by imagewise exposure. This dissolution takes place by way of formation of a soluble silver complex salt, which is concurrently diffused into the physical development nucleus layer or surface layer for forming a silver image on physical development nuclei by virtue of the reducing force of the developing agent. Use of a mesoionic compound as the silver halide complexing agent optimizes the conditions under which transfer silver grains are formed, ensuring that the resulting silver image has high ink-receptivity and improved resistance against printing wear.

In the prior art, thiocyanates were believed to be favorable silver halide complexing agents. They suffered from the problems of metal corrosion, restricted solution disposal, cumbersome operation during solution preparation due to deliquescence, and difficult solution management as previously mentioned. The mesoionic compounds can eliminate all these problems.

Preferably, the mesoionic compound is of formula (1):

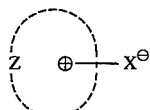
(1)

wherein Z is a ring formed from five or six atoms selected from the group consisting of a carbon atom, nitrogen atom, oxygen atom, sulfur atom, and selenium atom, and $X^-$ is $-O^-$, $-S^-$, or $-N^-R$ wherein R is selected from the group consisting of an alkyl, cycloalkyl, alkenyl, alkynyl, aralkyl, aryl, and heterocyclic radical.

In formula (1), Z is a five or six-membered ring, preferably a five-membered heterocyclic ring, for example, imadazolium, pyrazolium, oxazolium, thiazolium, triazolium, tetrazolium, thiadiazolium, oxadiazolium, thiatriazolium and oxatriazolium rings.

R represents a substituted or unsubstituted alkyl radical having 1 to 12 carbon atoms (e.g., methyl, ethyl, n-propyl, n-butyl, isopropyl, n-octyl, carboxyethyl, ethoxycarbonylmethyl, and dimethylaminoethyl radicals), a substituted or unsubstituted cycloalkyl radical having 3 to 12 carbon atoms (e.g., cyclohexyl and 4-methylcyclohexyl radicals), a substituted or unsubstituted alkenyl radical having 2 to 12 carbon atoms (e.g., propenyl radical), a substituted or unsubstituted alkynyl radical having 2 to 12 carbon atoms (e.g., propargyl and 1-methylpropargyl radicals), a substituted or unsubstituted aralkyl radical having 7 to 12 carbon atoms (e.g., benzyl and 4-methoxybenzyl radicals), a substituted or unsubstituted aryl radical having 6 to 12 carbon atoms (e.g., phenyl and 3-methoxyphenyl radicals), and a substituted or unsubstituted heterocyclic radical having 1 to 12 carbon atoms (e.g., pyridyl, imidazolyl, morpholino, triazolyl, tetrazolyl and thienyl radicals).

The heterocyclic ring represented by Z may have a substituent or substituents, for example, a nitro radical, a halogen atom (e.g., chloro and bromo), a mercapto radical, a cyano radical, a substituted or unsubstituted alkyl radical having 1 to 12 carbon atoms (e.g., methyl, ethyl, propyl, methoxyethyl, methylthioethyl, dimethylaminoethyl, trimethylammonioethyl, carboxymethyl, carboxyethyl, carboxypropyl, sulfoethyl, sulfomethyl, phosphonomethyl, and phosphonoethyl radicals), a substituted or unsubstituted aryl radical having 6 to 12 carbon atoms (e.g., phenyl and 4-sulfophenyl radicals), a substituted or unsubstituted alkenyl radical having 2 to 12 carbon atoms (e.g., allyl radical), a substituted or unsubstituted cycloalkyl radical having 3 to 12 carbon atoms (e.g., cyclohexyl radical), a substituted or unsubstituted alkynyl radical having 2 to 12 carbon atoms (e.g., propargyl radical), a substituted or unsubstituted aralkyl radical having 7 to 12 carbon atoms (e.g., benzyl and 4-methylbenzyl radicals), a substituted or unsubstituted alkoxy radical having 1 to 12 carbon atoms (e.g., methoxy, ethoxy and methoxyethoxy radicals), a substituted or unsubstituted aryloxy radical having 6 to 12 carbon atoms (e.g., phenoxy radical), a substituted or unsubstituted alkylthio radical having 1 to 12 carbon atoms (e.g., methylthio and ethylthio radicals), a substituted or unsubstituted arylthio radical having 6 to 12 carbon atoms (e.g., phenylthio radical), a substituted or unsubstituted sulfonyl radical having 1 to 12 carbon atoms (e.g., methanesulfonyl and p-toluenesulfonyl radicals), a substituted or unsubstituted carbamoyl radical having 1 to 12 carbon atoms (e.g., carbamoyl and methylcarbamoyl radicals), a substituted or unsubstituted thiocarbamoyl radical having 1 to 12 carbon atoms (e.g., dimethylthiocarbamoyl radical), a substituted or unsubstituted sulfamoyl radical having 0 to 12 carbon atoms (e.g., sulfamoyl, methylsulfamoyl and phenylsulfamoyl radicals), a substituted or unsubstituted carbonamide radical having 1 to 12 carbon atoms (e.g., acetamide, benzamide and methoxypropionamide radicals), a substituted or unsubstituted sulfonamide radical having 0 to 12 carbon atoms (e.g., methanesulfonamide and benzenesulfonamide radicals), a substituted or unsubstituted acyloxy radical having 1 to 12 carbon atoms (e.g., acetyloxy and benzoyloxy radicals), a substituted or unsubstituted sulfonyloxy radical having 1 to 12 carbon atoms (e.g., methanesulfonyloxy radical), a substituted or unsubstituted ureido radical having 1 to 12 carbon atoms (e.g., ureido, methylureido, ethylureido and methoxyethylureido radicals), a substituted or unsubstituted thioureido radical having 1 to 12 carbon atoms (e.g., thioureido, methylthioureido and methoxyethylthioureido radicals), a substituted or unsubstituted sulfamoylamino radical having 0 to 12 carbon atoms (e.g., sulfamoylamino and dimethylsulfamoylamino radicals), a substituted or unsubstituted acyl radical having 1 to 12 carbon atoms (e.g., acetyl and 4-methoxybenzoyl radicals), a substituted or unsubstituted thioacyl radical having 1 to 12 carbon atoms (e.g., thioacetyl radical), a substituted or unsubstituted heterocyclic radical having 1 to 12 carbon atoms (e.g., 1-morpholino, 1-pyperidino, 2-pyridyl, 4-pyridyl, 2-thienyl, 1-pyrazolyl, 1-imidazolyl, 2-tetrahydrofuryl, and tetrahydrothienyl radicals), a substituted or unsubstituted oxycarbonyl radical having 2 to 12 carbon atoms (e.g., methoxycarbonyl, phenoxycarbonyl and methoxyethoxycarbonyl radicals), a substituted or unsubstituted oxycarbonylamino radical having 2 to 12 carbon atoms (e.g., methoxycarbonylamino radical), a substituted or unsubstituted amino radical having 0 to 12 carbon atoms (e.g., amino and dimethylamino radicals), a carboxylic acid or a salt thereof, a sulfonic acid or a salt thereof, and a hydroxyl radical.

The compounds of formula (1) may form salts, for example, with acetic acid, nitric acid, salicylic acid, hydrochloric acid, iodic acid, bromic acid, etc.

In formula (1), $X^-$ is preferably $-S^-$.

More preferred among the mesoionic compounds of formula (1) are those of formula (2):

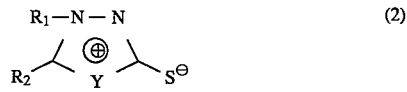
(2)

wherein $R_1$ and $R_2$ are independently selected from the group consisting of an alkyl, cycloalkyl, alkenyl, alkynyl, aralkyl, aryl and heterocyclic radical, $R_2$ may also be a hydrogen atom, and Y is $-O-$, $-S-$, or $-N(R_3)-$.

$R_3$ is selected from the group consisting of an alkyl, cycloalkyl, alkenyl, alkynyl, aralkyl, aryl, heterocyclic, amino, acylamino, sulfonamide, ureido, and sulfamoylamino radical. $R_1$ and $R_2$ taken together may form a ring, or $R_2$ and $R_3$ taken together may form a ring.

More particularly, $R_1$ and $R_2$ represent a substituted or unsubstituted alkyl radical having 1 to 12 carbon atoms (e.g., methyl, ethyl, n-propyl, t-butyl, methoxyethyl, methylthioethyl, dimethylaminoethyl, morpholinoethyl, dimethylaminoethylthioethyl, diethylaminoethyl, aminoethyl, methylthiomethyl, trimethylammonioethyl, carboxymethyl, carboxyethyl, carboxypropyl, sulfoethyl, sulfomethyl, phosphonomethyl and phosphonoethyl radicals), a substituted or unsubstituted cycloalkyl radical having 3 to 12 carbon atoms (e.g., cyclohexyl, cyclopentyl and 2-methylcyclohexyl radicals), a substituted or unsubstituted alkenyl radical having 2 to 12 carbon atoms (e.g., allyl and 2-methylallyl radicals), a substituted or unsubstituted alkynyl radical having 2 to 12 carbon atoms (e.g., propargyl radical), a substituted or unsubstituted aralkyl radical having 7 to 12 carbon atoms (e.g., benzyl, phenethyl and 4-methoxybenzyl radicals), a substituted or unsubstituted aryl radical having 6 to 12 carbon atoms (e.g., phenyl, naphthyl, 4-methylphenyl, 4-methoxyphenyl, 4-carboxyphenyl and 4-sulfophenyl radicals), and a substituted or unsubstituted heterocyclic radical having 1 to 12 carbon atoms (e.g., 2-pyridyl, 3-pyridyl, 4-pyridyl, 2-thienyl, 1-pyrazolyl, 1-imidazolyl and 2-tetrahydrofuryl radicals). $R_2$ may also represent a hydrogen atom.

$R_3$ represents a substituted or unsubstituted alkyl radical having 1 to 12 carbon atoms (e.g., methyl, ethyl, n-propyl, t-butyl, methoxyethyl, methylthioethyl, dimethylaminoethyl, morpholinoethyl, dimethylaminoethylthioethyl, diethylaminoethyl, aminoethyl, methylthiomethyl, trimethylammonioethyl, carboxymethyl, carboxyethyl, carboxypropyl, sulfoethyl, sulfomethyl, phosphonomethyl and phosphonoethyl radicals), a substituted or unsubstituted cycloalkyl radical having 3 to 12 carbon atoms (e.g., cyclohexyl, cyclopentyl and 2-methylcyclohexyl radicals), a substituted or unsubstituted alkenyl radical having 2 to 12 carbon atoms (e.g., allyl and 2-methylallyl radicals), a substituted or unsubstituted alkynyl radical having 2 to 12 carbon atoms (e.g., propargyl radical), a substituted or unsubstituted aralkyl radical having 7 to 12 carbon atoms (e.g., benzyl, phenethyl and 4-methoxybenzyl radicals), a substituted or unsubstituted aryl radical having 6 to 12 carbon atoms (e.g., phenyl, naphthyl, 4-methylphenyl, 4-methoxyphenyl, 4-carboxyphenyl and 4-sulfophenyl radicals), a substituted or unsubstituted heterocyclic radical having 1 to 12 carbon atoms (e.g., 2-pyridyl, 3-pyridyl, 4-pyridyl, 2-thienyl, 1-pyrazolyl, 1-imidazolyl and 2-tetrahydrofuryl radicals), a substituted or unsubstituted amino radical having 0 to 12 carbon atoms (e.g., amino, dimethylamino and methylamino radicals), a substituted or unsubstituted acylamino radical having 1 to 12 carbon atoms (e.g., acetylamino, benzoylamino and methoxypropionylamino radicals), a substituted or unsubstituted sulfonamide radical having 1 to 12 carbon atoms (e.g., methanesulfonamide, benzenesulfonamide and 4-toluenesulfonamide radicals), a substituted or unsubstituted ureido radical having 1 to 12 carbon atoms (e.g., ureido and 3-methylureido radicals), and a substituted or unsubstituted sulfamoylamino radical having 0 to 12 carbon atoms (e.g., sulfamoylamino and 3-methylsulfamoylamino radicals).

Preferably, Y represents —N($R_3$)—; $R_1$ and $R_3$ represent a substituted or unsubstituted alkyl radical having 1 to 6 carbon atoms, a substituted or unsubstituted alkenyl radical having 2 to 6 carbon atoms, a substituted or unsubstituted alkynyl radical having 2 to 6 carbon atoms, or a substituted or unsubstituted heterocyclic radical having 1 to 8 carbon atoms; and $R_2$ represents a hydrogen atom, a substituted or unsubstituted alkyl radical having 1 to 6 carbon atoms, a substituted or unsubstituted alkenyl radical having 2 to 6 carbon atoms, a substituted or unsubstituted alkynyl radical having 2 to 6 carbon atoms, or a substituted or unsubstituted heterocyclic radical having 1 to 8 carbon atoms.

Several illustrative, non-limiting examples of the mesoionic compound are given below (Compound Nos. 1 to 11).

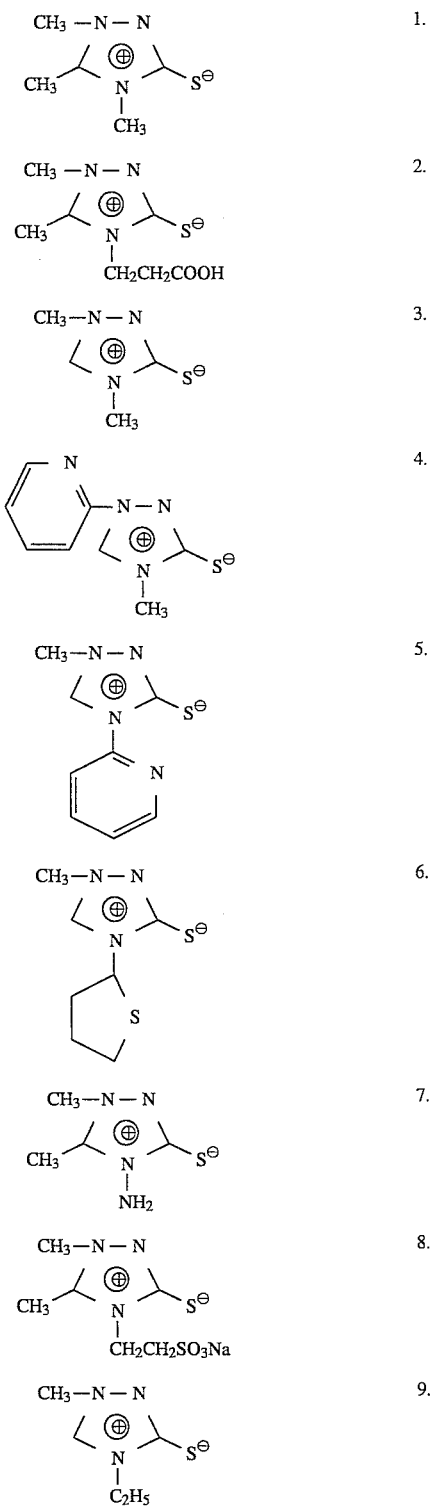

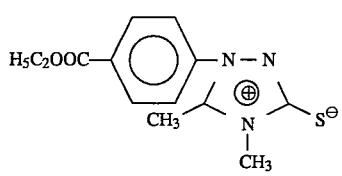

11.

The mesoionic compound is preferably added to the processing solution in a concentration of about $1\times10^{-5}$ to 10 mol/liter, more preferably $1\times10^{-3}$ to 3 mol/liter. Either a single mesoionic compound or a mixture of mesoionic compounds may be used. In the latter case, the total amount of mesoionic compounds falls in the above-defined concentration range.

In addition to the mesoionic compound, another silver halide complexing agent may be used in the processing solution insofar as the benefits of the invention are not lost. Examples of the other silver halide complexing agent which can be used in combination with the mesoionic compound include thiosulfates such as sodium thiosulfate, aminothiosulfates as disclosed in U.S. Pat. No. 3,169,992, cyclic imide compounds as disclosed in U.S. Pat. No. 2,857,276, 2-mercaptobenzoic acids as disclosed in JP-B 4099/1986, thiosalicylic acids and cyclic imide compounds having a five- and six-membered ring as disclosed in JP-B 4100/1986.

The diffusion transfer processing solution used herein is an alkaline processing solution which is prepared by adding a mesoionic compound to a composition essentially comprising an alkali buffer agent and a sulfite salt. The alkaline processing solution is generally used at pH 10 or higher, desirably pH 12 or higher. A developing agent may be contained in either the alkaline processing solution or the printing material. The developing agent used herein includes hydroquinone, 1-phenyl-3-pyrazolidone, N-methyl-p-aminophenol and the like.

In addition to the above ingredients, the alkaline processing solution may further contain an alkali buffer agent such as sodium hydroxide, potassium hydroxide, sodium tertiary phosphate, and sodium carbonate; a sulfite such as sodium sulfite; and optionally, a thickener such as hydroxyethyl cellulose and carboxymethyl cellulose; an antifoggant such as potassium bromide and 1-phenyl-5-mercaptotetrazole; and an agent for imparting ink affinity to resultant metallic silver such as long-chain alkyl-substituted mercaptotriazoles and mercaptooxazole.

The photosensitive material which is processed into a lithographic printing plate in accordance with the present invention includes a silver halide emulsion which contains silver chloride, silver bromide, silver chlorobromide, silver chloroiodide, silver chlorobromoiodide, or the like, preferably silver halide containing at least 50 mol % of silver chloride. The silver halide emulsion may contain commonly used emulsion additives, for example, spectral sensitizers, gelatin hardeners, coating aids, antifoggants, plasticizers, and developing agents.

The silver halide emulsion further contains a binder which may be selected from natural and synthetic binders commonly used for this purpose, for example, gelatin, colloidal albumin, and cellulose derivatives.

An undercoat layer may be disposed below the silver halide emulsion or nearer to the support, for example, as a primer layer for improving adhesion and an anti-halation layer. Such an undercoat may contain a developing agent.

The support which is coated with the silver halide emulsion includes paper, various types of film, plastics, paper coated with resinous substance, and metals.

The physical development nucleus layer contains physical development nuclei which are provided by well-known chemical compounds, for example, metals such as antimony, bismuth, cadmium, cobalt, palladium, nickel, silver, lead and zinc and sulfides of such metals. The physical development nucleus layer may also contain a developing agent as well as a hydrophilic binder.

A lithographic printing plate is prepared from a photosensitive material by imagewise exposing the photosensitive material, developing it with the above-defined diffusion transfer processing solution, and thereafter, processing it with a neutralizing solution. Normally development is carried out at about 20° to 40° C. for about 5 to 60 seconds and neutralization at about 20° to 40° C. for about 5 to 60 seconds.

EXAMPLE

Examples of the present invention are given below by way of illustration and not by way of limitation.

Example: 1

A double side polyethylene-coated paper support of 135 $g/m^2$ was coated on one side with a matte layer containing silica particles with a mean particle size of 5 μm. The support on the other side was treated with a corona discharge, coated with an anti-halation layer containing carbon black, and thereon with an orthochromatically sensitized high-contrast silver chloride emulsion containing silica particles with a mean particle size of 5 μm to a coverage of 20 $g/m^2$ of silver nitrate. Both the anti-halation and emulsion layers contained formaldehyde as a gelatin hardener. The support was dried and then heated at 40° C. for 30 days.

A palladium sulfide sol was prepared from solutions A and B.

| Solution A | |
| --- | --- |
| Palladium chloride | 5 g |
| Conc. hydrochloric acid | 40 ml |
| Water | 1 liter |
| Solution B | |
| Sodium sulfate | 8.6 g |
| Water | 1 liter |

With stirring, solution A was added to solution B. After 30 minutes of mixing, 1N sodium hydroxide was added to the solution to adjust it to pH 4, obtaining a coating sol. The palladium sulfide sol was coated onto the emulsion layer to a coverage of 10 $g/m^2$.

The thus prepared photosensitive material, which was an origin of a lithographic printing plate, was exposed imagewise by means of a letterpress camera having an image inversion mechanism and then developed at 30° C. for 20 seconds with an alkaline processing solution of the following composition:

| | |
| --- | --- |
| Sodium hydroxide | 20 g |
| Anhydrous sodium sulfite | 50 g |
| Hydroquinone | 10 g |
| 1-phenyl-3-pyrazolidone | 1 g |
| 3-mercapto-4-acetamide-5-n-heptyl-1,2,4-triazole | 200 mg |
| Silver halide complexing agent* | 50 mmol |

-continued

| | |
|---|---|
| Water totaling to | 1 liter |

The silver halide complexing agent (*) was changed as shown in Table 1.

After development, the material was treated at 25° C. for 20 seconds with a neutralizing solution of the following composition:

| | |
|---|---|
| Ethylene glycol | 5 g |
| Colloidal silica (20% aqueous solution) | 1 g |
| Citric acid | 10 g |
| Sodium citrate | 35 g |
| Water totaling to | 1 liter |

In this way, there were obtained printing plates which are designated Plates 1-1 to 1-7 in accordance with the silver halide complexing agents used in development as shown in Table 1.

Each of the printing plates was mounted in an offset press A. B. Dick 350CD (trade mark, by A. B. Dick Company). An etching solution of the following composition:

| | |
|---|---|
| Water | 600 ml |
| Isopropanol | 50 g |
| 3-mercapto-4-acetamide-5-n-butyl-1,2,4-triazole | 1 g | was thoroughly spread over the plate. The machine was operated for printing while dampening the plate with a 10-fold diluted fountain solution of the following composition:

| | |
|---|---|
| Water | 880 ml |
| Succinic acid | 6 g |
| Boric acid | 8.4 g |
| Sodium sulfate | 25 g |
| Ethylene glycol | 100 g |
| Colloidal silica (20% aqueous solution) | 28 g |

The plates were evaluated for ink receptivity and plate wear by the following procedures.

Ink receptivity

The ink used was A. B. Dick Offset Ink 3-1012. Paper feed was started at the same time as an inking roller was contacted against the plate. The number of paper sheets fed until an acceptable image density was reached was counted. "None" means that the plate did not receive ink at all.

Plate wear

Printing was continued over 1,000 sheets. The number of acceptably printed paper sheets was counted until ink skips were detected in the image.

The results are shown in Table 1.

TABLE 1

| Printing plate | Silver halide complexing agent | Ink receptivity | Plate wear | Remarks |
|---|---|---|---|---|
| 1-1* | — | None | — | — |
| 1-2* | Sodium thiosulfate | 100 | 200 | — |
| 1-3* | Potassium thiocyanate | 50 | 500 | ** |
| 1-4* | 2-mercaptobenzoic acid | 100 | 200 | — |
| 1-5 | Compound No. 1 | 20 | >5000 | — |

TABLE 1-continued

| Printing plate | Silver halide complexing agent | Ink receptivity | Plate wear | Remarks |
|---|---|---|---|---|
| 1-6 | Compound No. 3 | 20 | >5000 | — |
| 1-7 | Compound No. 1 (30 mmol) Compound No. 8 (20 mmol) | 15 | >5000 | — |

*comparison
**(1) As processing was repeated, metal members of processing equipment were corroded. (2) The used solution was under the restriction of waste water disposal. (3) Solution preparation needed careful handling due to deliquescence.

As seen from Table 1, those printing plates which had been developed with developers containing compounds of formula (1), that is, Plates 1-5, 1-6 and 1-7, exhibit good ink receptivity and are extremely improved in plate wear as compared with the comparative ones. The inventive plates are free from the corrosion and waste solution disposal problems associated with thiocyanate.

Example 2

A double side polyethylene-coated paper support of 135 g/m$^2$ was coated on one side with a matte layer containing silica particles with a mean particle size of 5 μm. The support on the other side was treated with a corona discharge, coated with an anti-halation layer containing 2 g/m$^2$ of hydroquinone, 0.1 g/m$^2$ of 1-phenyl-3-pyrazolidone and carbon black, and thereon with a silver chloride emulsion of the same composition as in Example 1 except for panchromatic sensitization. A palladium sulfide sol (Example 1) was coated onto the emulsion layer, obtaining a photosensitive material which was an origin of a lithographic printing plate.

The photosensitive material was exposed by means of a helium neon laser image setter and then developed at 30° C. for 30 seconds with an alkaline processing solution of the following composition:

| | |
|---|---|
| Sodium hydroxide | 20 g |
| Anhydrous sodium sulfite | 50 g |
| Sodium thiosulfate pentahydrate | 1.2 g |
| 2-p-methylphenyl-2-mercapto-1,3,4-oxadiazole | 300 mg |
| Silver halide complexing agent* | 100 mmol |
| Water totaling to | 1 liter |

The silver halide complexing agent (*) was changed as shown in Table 2. After development, the material was neutralized with a neutralizing solution as in Example 1.

In this way, there were obtained printing plates which are designated Plates 2-1 to 2-4 in accordance with the silver halide complexing agents used in development as shown in Table 2. They were evaluated by printing as in Example 1. The results are shown in Table 2.

TABLE 2

| Printing plate | Silver halide complexing agent | Ink receptivity | Plate wear | Remarks |
|---|---|---|---|---|
| 2-1* | — | None | — | — |
| 2-2* | Potassium thiocyanate | 20 | 1000 | ** |
| 2-3 | Compound No. 3 | 15 | >5000 | — |
| 2-4 | Compound No. 1 | 15 | >5000 | — |

*comparison

TABLE 2-continued

| Printing plate | Silver halide complexing agent | Ink receptivity | Plate wear | Remarks |
| --- | --- | --- | --- | --- |

**(1) As processing was repeated, metal members of processing equipment were corroded. (2) The used solution was under the restriction of waste water disposal. (3) Solution preparation needed careful handling due to deliquescence.

As seen from Table 2, those printing plates which had been developed with developers containing compounds of formula (1), that is, Plates 2-3 and 2-4, exhibit good ink receptivity and are extremely improved in plate wear as compared with the comparative ones. The inventive plates are free from the problems associated with thiocyanate.

According to the present invention, lithographic printing plates having good ink receptivity and minimized plate wear are obtained. The processing solution is easy to handle since it eliminates the problems of corrosion of processing equipment and waste solution disposal.

I claim:

1. A method for preparing a lithographic printing plate from a photosensitive material, wherein said photosensitive material comprises at least a silver halide emulsion layer and a physical development nucleus layer on a support, comprising the steps of:

(a) imagewise exposing said photosensitive material;

(b) developing the resulting photosensitive material with a diffusion transfer processing solution, comprising at least one mesoionic compound; and (c) processing the resulting photosensitive material with a neutralizing solution, thereby obtaining said lithographic printing plate, wherein said mesoionic compound is represented by formula (2):

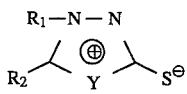

$$R_1-N-N$$
$$R_2 \diagdown \overset{\oplus}{Y} \diagup S^{\ominus}$$

(2)

wherein $R_1$ and $R_2$ are independently selected from the group consisting of an alkyl, cycloalkyl, alkenyl, alkynyl, aralkyl, aryl and heterocyclic radical, $R_2$ may also be a hydrogen atom, Y is —N($R_3$)—, wherein $R_3$ is selected from the group consisting of an alkyl, cycloalkyl, alkenyl, alkynyl, aralkyl, aryl, heterocyclic, amino, acylamino, sulfonamide, ureido, and sulfamoylamino, and $R_1$ and $R_2$, and $R_2$ and $R_3$ taken together may form a ring.

2. The method according to claim 1, wherein $R_3$ is selected from the group consisting of substituted or unsubstituted alkyl having 1 to 12 carbon atoms, substituted or unsubstituted cycloalkyl having 3 to 12 carbon atoms, substituted or unsubstituted alkenyl having 2 to 12 carbon atoms, substituted or unsubstituted alkynyl having 2 to 12 carbon atoms, substituted or unsubstituted aralkyl having 7 to 12 carbon atoms, substituted or unsubstituted aryl having 6 to 12 carbon atoms, substituted or unsubstituted heterocyclic having 1 to 12 carbon atoms, substituted or unsubstituted amino having 0 to 12 carbon atoms, substituted or unsubstituted acylamino having 1 to 12 carbon atoms, substituted or unsubstituted sulfonamide having 1 to 12 carbon atoms, substituted or unsubstituted ureido having 1 to 12 carbon atoms, and substituted or unsubstituted sulfamoylamino having 0 to 12 carbon atoms.

3. The method according to claim 2, wherein said substituted or unsubstituted alkyl is selected from the group consisting of methyl, ethyl, n-propyl, t-butyl, methoxyethyl, methylthioethyl, dimethylaminoethyl, morpholinoethyl, dimethylaminoethylthioethyl, diethylaminoethyl, aminoethyl, methylthiomethyl, trimethylammonioethyl, carboxymethyl, carboxyethyl, carboxypropyl, sulfoethyl, sulfomethyl, phosphonomethyl and phosphonoethyl.

4. The method according to claim 2, wherein said substituted or unsubstituted cycloalkyl is selected from the group consisting of cyclohexyl, cyclopentyl and 2-methylcyclohexyl.

5. The method according to claim 2, wherein said substituted or unsubstituted alkenyl is selected from the group consisting of allyl and 2-methylallyl.

6. The method according to claim 2, wherein said substituted or unsubstituted alkynyl is propargyl.

7. The method according to claim 2, wherein said substituted or unsubstituted aralkyl is selected from the group consisting of benzyl, phenethyl and 4-methoxybenzyl.

8. The method according to claim 2, wherein said substituted or unsubstituted aryl is selected from the group consisting of phenyl, naphthyl, 4-methylphenyl, 4-methoxyphenyl, 4-carboxyphenyl and 4-sulfophenyl.

9. The method according to claim 2, wherein said substituted or unsubstituted heterocyclic is selected from the group consisting of 2-pyridyl, 3-pyridyl, 4-pyridyl, 2-thienyl, 1-pyrazolyl, 1-imidazolyl and 2-tetrahydrofuryl.

10. The method according to claim 2, wherein said substituted or unsubstituted amino is selected from the group consisting of amino, dimethylamino and methylamino.

11. The method according to claim 2, wherein said substituted or unsubstituted acylamino is selected from the group consisting of acetylamino, benzoylamino and methoxypropionylamino.

12. The method according to claim 2, wherein said substituted or unsubstituted sulfonylamide is selected from the group consisting of methanesulfonamide, benzenesulfonamide and 4-toluenesulfonamide.

13. The method according to claim 2, wherein said substituted or unsubstituted ureido is selected from the group consisting of ureido and 3-methylureido.

14. The method according to claim 2, wherein said substituted or unsubstituted sulfamoylamino is selected from the group consisting of sulfamoylamino and 3-methylsulfamoylamino.

* * * * *